United States Patent [19]

Matsuda

[11] Patent Number: 4,866,009
[45] Date of Patent: Sep. 12, 1989

[54] MULTILAYER WIRING TECHNIQUE FOR A SEMICONDUCTOR DEVICE

[75] Inventor: Tetsuo Matsuda, Kunitachi, Japan

[73] Assignee: Kabushiki Kaisha Toshiba, Kawasaki, Japan

[21] Appl. No.: 306,211

[22] Filed: Feb. 3, 1989

Related U.S. Application Data

[63] Continuation of Ser. No. 94,315, Sep. 8, 1987, abandoned.

[30] Foreign Application Priority Data

Nov. 17, 1986 [JP] Japan .................................. 61-273652

[51] Int. Cl.$^4$ .............................................. H01L 21/44
[52] U.S. Cl. ..................................... 437/203; 437/190; 437/192; 437/195; 437/10; 357/71; 148/DIG. 50; 148/DIG 60
[58] Field of Search ............... 437/203, 190, 192, 195, 437/189; 357/65, 71; 148/DIG. 60, DIG. 50

[56] References Cited

U.S. PATENT DOCUMENTS

| | | | |
|---|---|---|---|
| 3,323,198 | 6/1967 | Shortes | 437/184 |
| 3,382,568 | 5/1968 | Kuiper | 437/193 |
| 4,184,909 | 1/1980 | Chang et al. | 437/190 |
| 4,265,935 | 5/1981 | Hall | 437/193 |
| 4,536,949 | 8/1985 | Takayama et al. | 437/195 |
| 4,619,037 | 10/1986 | Taguchi et al. | 437/195 |

Primary Examiner—Brian E. Hearn
Assistant Examiner—Beverly A. Pawlikowski
Attorney, Agent, or Firm—Oblon, Spivak, McClelland, Maier & Neustadt

[57] ABSTRACT

A method of manufacturing a semiconductor device includes the steps of (a) forming a first conductive pattern on a semiconductor substrate, (b) forming a first interlayer insulating film, covering the first conductive pattern, (c) forming a second conductive pattern, composed of a refractory metal, on the first interlayer insulating film, (d) forming a contact hole reaching the first conductive pattern through the second conductive pattern and the first interlayer insulating film at a predetermined position, (e) performing an annealing step before or after formation of the contact hole in step (d), and (f) covering in the contact hole with a metal film, after annealing step (e), to connect the second conductive pattern to the first conductive pattern. In this method, annealing step—for example, gettering—is performed before the wiring layer of the refractory metal is placed in contact with the semiconductor layer. For this reason, even if the other semiconductor layers are made of silicon, silicification of the refractory metal can be prevented.

12 Claims, 2 Drawing Sheets

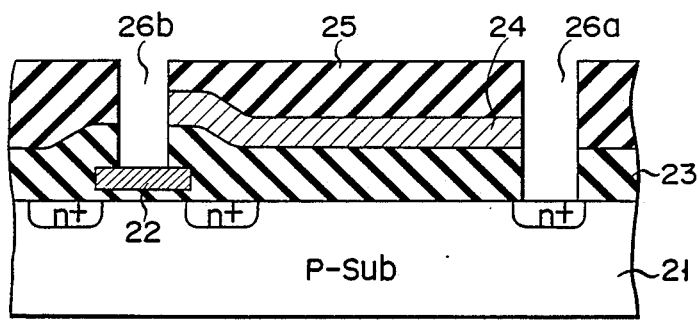
F I G. 2C
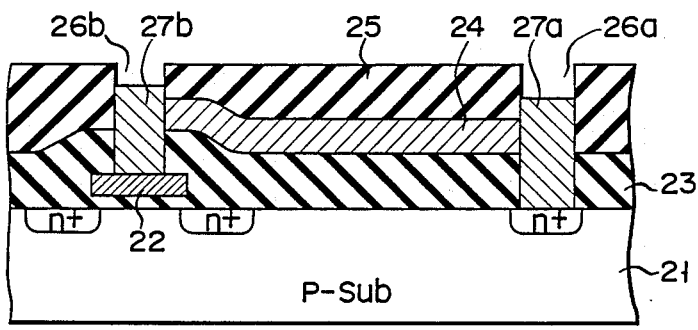
F I G. 2D
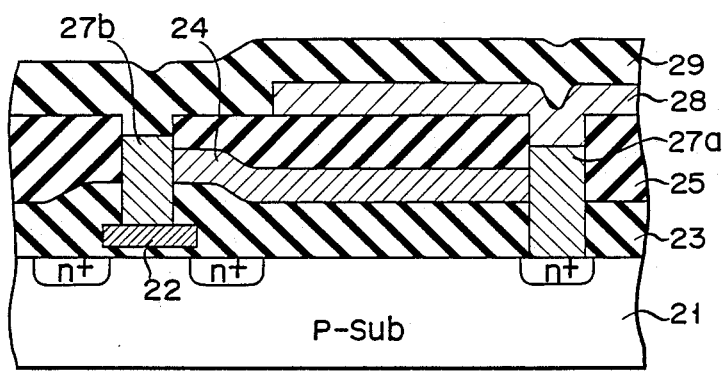
F I G. 2E

MULTILAYER WIRING TECHNIQUE FOR A SEMICONDUCTOR DEVICE

This application is a continuation of application Ser. No. 094,315, filed on Sept. 8, 1987, now abandoned.

BACKGROUND OF THE INVENTION

1. Field of the Invention

The present invention relates to a method of manufacturing a semiconductor device and, more particularly, to an improvement in a wiring formation step performed during the manufacturing of a semiconductor device.

2. Description of the Prior Art

In recent years, the degree of integration of semiconductor integrated circuits has been increased significantly, and this trend is expected to continue in the future. This high degree of integration is achieved by micropatterning and by the high packing density of elements. A multilayer wiring technique is widely used to achieve micropatterning and high packing density.

With regard to the multilayer wiring technique, the following three conditions must be observed.

First, the resistance of the wiring must be low.

Second, an interlayer insulating film interposed between wiring layers must be able to be planarized easily.

Third, wiring layers must be able to be connected easily.

With these conditions in mind, various multilayer wiring techniques have been investigated. However, due to a variety of problems encountered during the actual manufacturing steps, no technique has yet been found for producing a multilayer wiring structure, which satisfies all the above conditions.

FIG. 1 is a sectional view showing an example of a normal multilayer wiring structure in a conventional semiconductor device. In FIG. 1, reference numeral 11 denotes a p-type silicon substrate. Various n+-type impurity regions for constituting elements—e.g., transistors—required in an integrated circuit, are formed in substrate 11. First layer wiring 12 composed of a polycrystalline silicon film is formed on substrate 11, and an insulating film is interposed between wiring 12 and substrate 11. Wiring 12 is covered with interlayer insulating film 13 composed of $SiO_2$. Second layer wiring 14, composed of a metal such as Al, is formed on film 13. Wiring 14 is connected to wiring 12 and substrate 11 via contact holes formed in film 13. This multilayer wiring structure results from forming wiring 12 first, then depositing film 13, forming the contact holes, and then depositing and patterning a second layer wiring material.

The above conventional multilayer wiring structure does, however, have the following drawbacks:

Al or an Al alloy, which is normally used as a wiring material of wiring 14, has a low melting point. For this reason, when wiring 14 is to be formed, using this material, gettering accompanied by high-temperature annealing cannot be sufficiently performed because the wiring 14 is melted. In addition, when wiring 14 is to be covered with an insulating film, a high-temperature melting step cannot be used for planarizing the insulating film. For this reason, in order to planarize the insulating film, a complex step such as an etch-back method or a lift-off method must be performed instead.

Otherwise, when polycrystalline silicon or a silicide of a refractory metal which has high melting point is used as the material of wiring 14, high-temperature annealing can be performed without any trouble. However, the wiring resistance is then increased to several tens to several hundred times that achieved when aluminum is used. For this reason, signal delay occurs between semiconductor elements, thereby posing a serious problem with regard to circuit design.

On the other hand, refractory metals such as molibdenum or tungsten have high melting points and low resistances. Therefore, when such a refractory metal is used as a second layer wiring material, it is assumed that the first and second conditions are satisfied. However, in this case also, when a heating step such as high-temperature melting is performed for gettering or planarizing, the wiring resistance is increased significantly. The reason for this is as follows:

As is shown in FIG. 1, layer 14 made of a refractory metal is in contact with polycrystalline silicon wiring 12 and silicon substrate 11. Therefore, when high-temperature annealing is performed, wiring 14 reacts with wiring 12 and substrate 11 at a contact portion therebetween, thereby being converted to silicide of the refractory metal. Although a process for preventing the formation of such a silicide is known, according to such a process, the wiring structure becomes complex and the number of necessary contact holes to connect the wires is increased. For this reason, micropatterning of elements is prevented, and the above-mentioned third conditions cannot be satisfied.

As has been described above, according to the conventional multilayer wiring technique, regardless of the wiring materials selected, the above three conditions required for a multilayer-wiring technique cannot be satisfied at the same time.

SUMMARY OF THE INVENTION

It is therefore an object of the present invention to provide a multilayer wiring technique for manufacturing a semiconductor device, in which a high-temperature annealing step for gettering or planarizing an insulating film can be used, which can sufficiently decrease wiring resistance, and which is suitable for the micropatterning of elements.

The above object of the present invention can be achieved by way of a method of manufacturing a semiconductor device, which comprises the steps of:

(a) forming a first conductive pattern on a semiconductor substrate;

(b) forming a first interlayer insulating film, covering the first conductive pattern;

(c) forming a second conductive pattern, composed of a refractory metal, on the first interlayer insulating film;

(d) forming a contact hole reaching the first conductive pattern through the second conductive pattern and the first interlayer insulating film at a predetermined position;

(e) performing an annealing step before or after formation of the contact hole in step (d); and (f) covering the contact hole with a metal film, after annealing step (e), to connect the second conductive pattern to the first conductive pattern.

When the above manufacturing method is used, the first conductive pattern may be a wiring layer (e.g., a gate electrode) formed on the semiconductor substrate interposed with the insulating film, it may be a diffusion layer (e.g., a diffusion wiring layer, a source region, and a drain region) formed in the semiconductor substrate, or it may be both.

According to the present invention, high-temperature annealing such as gettering is performed before the wiring layer of a refractory metal is placed in contact with the other wiring layers and the semiconductor substrate. Therefore, even when the other wiring layers and the semiconductor substrate are made of silicon, silicification (conversion to silicide) of a refractory metal can be prevented.

BRIEF DESCRIPTION OF THE DRAWINGS

FIGS. 2A to 2E are sectional views showing wiring formation steps according to an embodiment of the present invention in sequence.

DETAILED DESCRIPTION OF THE PREFERRED EMBODIMENT

An embodiment of the present invention will be described below with reference to FIGS. 2A to 2E.

Figure 1:
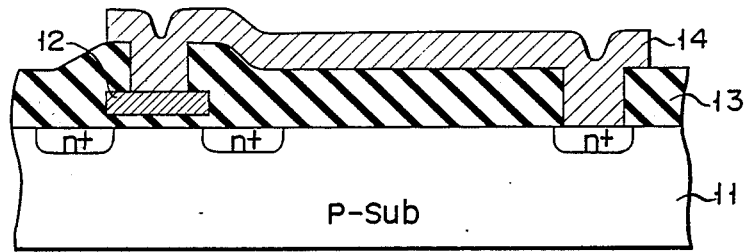
FIG. 1 is a sectional view showing a normal multilayer wiring structure of a semiconductor device obtained by a conventional manufacturing method.
Figure 2A:
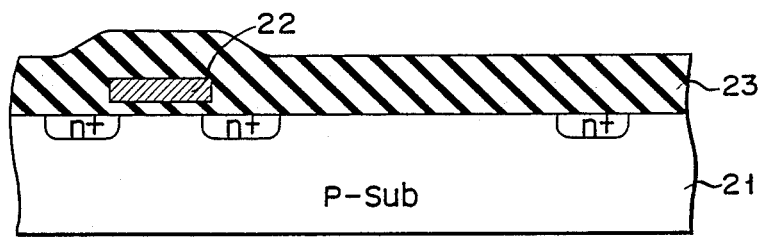

First, as shown in FIG. 2A, gate electrode 22 (first layer wiring) consisting of a polycrystalline silicon film is formed on (100) p-type silicon substrate 21, interposed with a gate oxide film. Subsequently, using known impurity doping means, impurity regions such as n+-type source and drain regions are formed in substrate 21, thereby forming elements such as a MOS transistor. Thereafter, 5,000-Å thick $SiO_2$ is deposited on the entire surface of the resultant structure by CVD (Chemical Vapor Deposition) to form first interlayer insulating film 23.

Figure 2B:
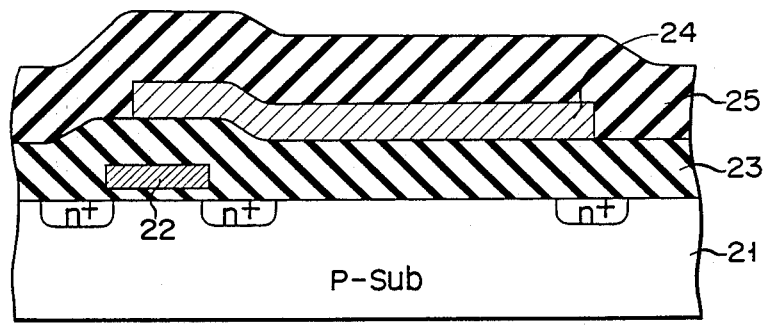

In the next step shown in FIG. 2B, a 4,000-Å thick tungsten film is deposited on film 23 by sputtering and patterned to be a desired shape, thereby forming second layer wiring 24. Subsequently, 4,000-Å thick $SiO_2$ (BPSG) containing boron and phosphorus respectively of 10% by weight is deposited by CVD to form second interlayer insulating film 25. At this time, as shown in FIG. 2B, the surface of film 25 has a relatively large indentation reflecting that on an underlying surface. Note that film 25 may be an $SiO_2$ film (PSG film) containing only phosphorus of high concentration (e.g., 10% by weight).

In order to perform gettering of, e.g., undesirable mobile ions such as Na and to flatten the surface of film 25 by high-temperature melting, annealing is performed in a nitrogen atmosphere at a temperature of 950° C. for 30 minutes. By this annealing, film 25 *melted and planarized, and the mobile ions present in the gate oxide film of the MOS transistor are trapped around phosphorus, thereby achieving gettering. At the same time, a resistance of the tungsten film constituting wiring 24 is decreased. That is, a resistivity of wiring 24 is decreased from about* 50 $\mu\Omega$·cm to 10 $\mu\Omega$·cm after annealing. It can be assumed that this is because crystallization of tungsten progresses. In addition, in this high-temperature annealing step, since wiring 24 consisting of the tungsten film is not in contact with underlying silicon portions 21 and 22, inconvenience such as partial silicification of tungsten does not occur. Note that as film 25, $SiO_2$ (AsSG) containing arsenic of high concentration, e.g., 10% by weight may be used. In this case also, melting, planarizing, and gettering can be achieved by performing annealing in a $POCl_3$ gas.

Then, as shown in FIG. 2C, contact holes 26 (26a and 26b) for connecting wiring 24 to wiring 22 and substrate 21 are formed by photolithography. The surface of substrate 21 is exposed at the bottom of hole 26a, and the polycrystalline silicon surface is exposed at the bottom of hole 26b. In addition, the tungsten surfaces are partially exposed on the side walls of holes 26a and 26b.

Subsequently, a tungsten film is formed by selective CVD using $WF_6$ and $H_2$ gases as a reaction gas. Selective CVD is performed under the conditions that a pressure of a gas mixture of $WF_6+H_2$ is 0.2 Torr and a reaction time is 25 minutes. As a result, as shown in FIG. 2D, tungsten films 27 (27a and 27b) are grown on the surface except $SiO_2$, i.e., only on the exposed surface of substrate 21, the polycrystalline silicon surface of electrode 22, and the tungsten surface of wiring 24 in the contact hole. Once the tungsten film is formed, growth of the W film progresses also on its surface by reduction of $WF_6$. Therefore, tungsten films 27a and 27b are grown so as to cover in holes 26a and 26b. As a result, wiring 24 is connected to wiring 22 and substrate 21 through films 27a and 27b.

Finally, as shown in FIG. 2E, an aluminum film is deposited on the entire surface of the resultant structure by sputtering and is then patterned to form third layer wiring 28. At this time, since film 25 is sufficiently planarized in the preceding annealing step, coverage of wiring 28 is good, and high reliability and yield can be obtained. Subsequently, 5,000-Å thick $SiO_2$ is deposited on the entire surface by CVD to form passivation film 29. Thus, a semiconductor device having a three-layered wiring structure is obtained.

According to the method of the above embodiment, since either of the first and second layer wirings 22, 24 is formed by a refractory material, the second interlayer insulating film 25 can be planarized by high-temperature melting. Therefore, reliability of a wiring to be formed thereon can be improved. In addition, since the high-temperature annealing for planarizing and gettering is performed before wiring 24 consisting of tungsten is in contact with the silicon surface, silicification of tungsten can be prevented, and a multilayer wiring structure having layer 24 with a sufficiently small resistance can be formed.

Furthermore, holes 26 are buried with W films 27 by selective CVD, so that steps at the contact holes can be decreased. Moreover, since the number of contact holes for obtaining connections between different wiring layers is the same as that of a conventional multilayer wiring structure, the respective wiring layers can be easily connected with each other. Therefore, the structure is not complicated, and hence micropatterning is not prevented.

Note that the present invention is not limited to the above embodiment but includes various modifications. For example, when planarizing of the second interlayer insulating film is not so much required, high-temperature annealing may be performed before the second interlayer insulating film is formed. Also in this case, a resistance of the refractory metal film can be effectively decreased. In addition, high-temperature annealing may be performed after formation of the contact holes.

Furthermore, the metal film to be covered in the contact holes is not limited to refractory metals such as tungsten but may be a low-melting point metal film such as an aluminum film. Moreover, the step of burying the metal film is not limited to selective CVD. For example, after formation of the metal film by normal CVD, the metal film may be etched except for portions at the contact holes. That is, the present invention can be variously modified to be carried out without departing from the spirit and scope of the invention.

What is claimed is:

1. A method of manufacturing a semiconductor device, comprising the steps of:
   (a) forming a first conductive pattern on a semiconductor substrate; the first conductive pattern being composed of a material selected from the group consisting of refractory metals, refractory metal silicide and silicon;
   (b) forming a first interlayer insulating film, covering said first conductive pattern;
   (c) forming a second conductive pattern, which is composed of a refractory metal and is to be connected to said first conductive pattern and said semiconductor substrate, on said first interlayer insulating film;
   (d) forming a contact hole reaching said first conductive pattern and said semiconductor substrate through said second conductive pattern and said first interlayer insulating film at a predetermined position;
   (e) performing an annealing step for gettering planarizing the surface of the insulating film and lowering the resistivity of the first and second conductive patterns, as necessary, at a time different from said step of forming said contact hole; and
   (f) covering said contact hole with a metal film by selective CVD method, after said annealing step, to connect said second conductive pattern to said first conductive pattern and said semiconductor substrate.

2. A method according to claim 1, wherein tungsten is used as said refractory metal and as a metal for covering in said contact hole.

3. A method according to claim 1, wherein said semiconductor substrate and said first conductive pattern are composed of silicon.

4. A method according to claim 1, wherein said annealing step achieves gettering.

5. A method according to claim 1, further comprising the step of:
   forming a second interlayer insulating film containing an impurity of a concentration, after said step (c) and before said step (d).

6. A method according to claim 5, wherein said annealing step achieves melting and flattening a surface of said second interlayer insulating film.

7. A method of manufacturing a semiconductor device, comprising the steps of:
   (a) forming a first conductive pattern on a semiconductor substrate; the first conductive pattern being composed of a material selected from the group consisting of refractory metals, refractory metal silicide and silicon;
   (b) forming a first interlayer insulating film, covering said first conductive pattern;
   (c) forming a second conductive pattern, which is composed of a refractory metal and is to be connected to said first conductive pattern and said semiconductor substrate, on said first interlayer insulating film;
   (d) forming a second interlayer insulating film, covering said second conductive pattern;
   (e) forming a contact hole reaching said first conductive pattern and said semiconductor substrate through said second conductive pattern and said first and second interlayer insulating films at a predetermined position;
   (f) performing an annealing step for gettering, planarizing the surface of the insulating film and lowering the resistivity of the first and second conductive patterns, as necessary, at a time different from said step of forming said contact hole; and
   (g) covering said contact hole with a metal film by selective CVD method, after said annealing step, to connect said second conductive pattern to said first conductive pattern and said semiconductor substrate;
   (h) forming a third conductive pattern, connected to said second conductive pattern through said contact hole on said second interlayer insulating film, after said contact hole is covered with the metal film.

8. A method according to claim 7, wherein tungsten is used as said refractory metal and as a metal for covering in said contact hole.

9. A method according to claim 7, wherein said semiconductor substrate and said first conductive layer are composed of silicon.

10. A method according to claim 7, wherein said second interlayer insulating film contains an impurity of a high concentration.

11. A method according to claim 7, wherein said annealing step achieves melting and flattening a surface of said second interlayer insulating film.

12. A method according to claim 7, wherein said annealing step achieves gettering.

* * * * *